United States Patent [19]
Lewyn

[11] Patent Number: 5,781,132
[45] Date of Patent: Jul. 14, 1998

[54] ERROR CORRECTING DECODER

[75] Inventor: Lanny L. Lewyn, Laguna Beach, Calif.

[73] Assignee: Brooktree Corporation, San Diego, Calif.

[21] Appl. No.: 587,755

[22] Filed: Jan. 17, 1996

[51] Int. Cl.[6] .................................................. H03M 1/36
[52] U.S. Cl. ......................... 341/159; 341/118; 341/158; 341/160
[58] Field of Search .................................. 341/158, 159, 341/160, 118

[56] References Cited

U.S. PATENT DOCUMENTS

| | | | |
|---|---|---|---|
| 4,712,087 | 12/1987 | Traa | 340/347 CC |
| 4,774,498 | 9/1988 | Traa | 340/347 AD |
| 4,870,417 | 9/1989 | Van De Plaasche et al. | 341/118 |
| 4,897,657 | 1/1990 | Brubaker | 341/159 |
| 4,983,968 | 1/1991 | Nguyen et al. | 341/118 |
| 5,029,305 | 7/1991 | Richardson | 341/159 |
| 5,119,098 | 6/1992 | Komatsu et al. | 341/159 |
| 5,182,560 | 1/1993 | Shiwaku | 341/158 |

Primary Examiner—Jeffrey A. Gaffin
Assistant Examiner—Jason L. W. Kost
Attorney, Agent, or Firm—William C. Cray; Susie H. Oh

[57] ABSTRACT

The magnitudes of an input voltage and individual ones of progressive fractions of a reference voltage are compared to produce first and second output voltages. Each of the elements in a first logical network receives the first output voltage from an individual one of the comparators and the second output voltage from a comparator non-consecutive with (preferably 2 comparators removed from) such individual comparator. Signals from these elements pass to latches. The latches have assertion and negation outputs which pass to elements in a second logical network. When an individual one of the elements in the second logical network provides a particular output, it prevents the elements receiving outputs from comparators responsive to lower reference voltage fractions from providing the particular output. When an element in the second logical network responsive to a latch with a higher reference voltage fraction provides an output within a preset time, its output supersedes that of the lower individual element and prevents all lower elements in such logical network from responding. In this way, only the element in the second logical network responsive to the highest reference voltage fraction within the preset time provides an output after the latches are rendered non-transparent by a second clocking signal. Elements in the second logical network are strobed by a third clocking signal at a later preset time to indicate the input voltage magnitude.

46 Claims, 9 Drawing Sheets

FIG. 1b

| OUTPUT LINE | VOLTAGE OUTPUT | OUTPUT LINE | VOLTAGE OUTPUT | DIGITAL VALUE |
|---|---|---|---|---|
| 21a | 0 | 28a | 0 | 111 |
| 23a | 1 | | | |
| 21b | 0 | 28b | 0 | 110 |
| 23b | 1 | | | |
| 21c | 0 | 28c | 0 | 101 |
| 23c | 1 | | | |
| 21d | 1 | 28d | 1 | 100 |
| 23d | 0 | | | |
| 21e | 0 | 28e | 0 | 011 |
| 23e | 1 | | | |
| 21f | 0 | 28f | 0 | 010 |
| 23f | 1 | | | |
| 21g | 1 | 28g | 1 | 001 |
| 23g | 0 | | | |
| 21h | 1 | 28h | 0 | 000 |
| 23h | 0 | | | |

FIG. 2b

| OUTPUT LINE | VOLTAGE OUTPUT | OUTPUT LINE | VOLTAGE OUTPUT | DIGITAL VALUE |
|---|---|---|---|---|
| VDD | 1 | 28a | 0 | 111 |
| 21a | 0 | | | |
| VDD | 1 | | | |
| VDD | 1 | 28b | 0 | 110 |
| 23a | 1 | | | |
| 21b | 0 | | | |
| VDD | 1 | | | |
| 23a | 1 | 28c | 1 | 101 |
| 23b | 1 | | | |
| 21c | 1 | | | |
| 23a | 1 | | | |
| 23b | 1 | 28d | 0 | 100 |
| 23c | 0 | | | |
| 21d | 0 | | | |
| 23b | 1 | | | |
| 23c | 0 | 28e | 0 | 011 |
| 23d | 1 | | | |
| 21e | 0 | | | |
| 23c | 0 | | | |
| 23d | 1 | 28f | 0 | 010 |
| 23e | 1 | | | |
| 21f | 0 | | | |
| 23d | 1 | | | |
| 23e | 1 | 28g | 1 | 001 |
| 23f | 1 | | | |
| 21g | 1 | | | |
| 23e | 1 | | | |
| 23f | 1 | 28h | 0 | 000 |
| 23g | 0 | | | |
| 21h | 1 | | | |

FIG. 3a

| OUTPUT LINE | OUT VALUE | INPUT LINE | IN VALUE | OUTPUT LINE | LOGIC OUTPUT | DIGITAL VALUE |
|---|---|---|---|---|---|---|
| 21a | 0 | 21a | 0 | 27a | 0 | 111 |
| 44a | 1 | 42b | 1 | | | |
| | | | | 27b | 0 | 110 |
| 21b | 0 | 21b | 0 | | | |
| 44b | 1 | 44a | 1 | | | |
| | | | | 27c | 0 | 101 |
| 21c | 0 | 21c | 0 | | | |
| 44c | 1 | 44b | 1 | | | |
| | | | | 27d | 0 | 100 |
| 21d | 0 | 21d | 0 | | | |
| 44d | 1 | 44c | 1 | | | |
| | | | | 27c | 0 | 011 |
| 21e | 0 | 21e | 0 | | | |
| 44e | 1 | 44d | 1 | | | |
| | | | | 27f | 1 | 010 |
| 21f | 1 | 21f | 1 | | | |
| 44f | 0 | 44e | 1 | | | |
| | | | | 27g | 1 | 001 |
| 21g | 1 | 21g | 1 | | | |
| 44g | 0 | 44f | 0 | | | |
| | | | | 27h | 0 | 000 |
| 21h | 1 | 21h | 1 | | | |
| 44h | 0 | | | | | |

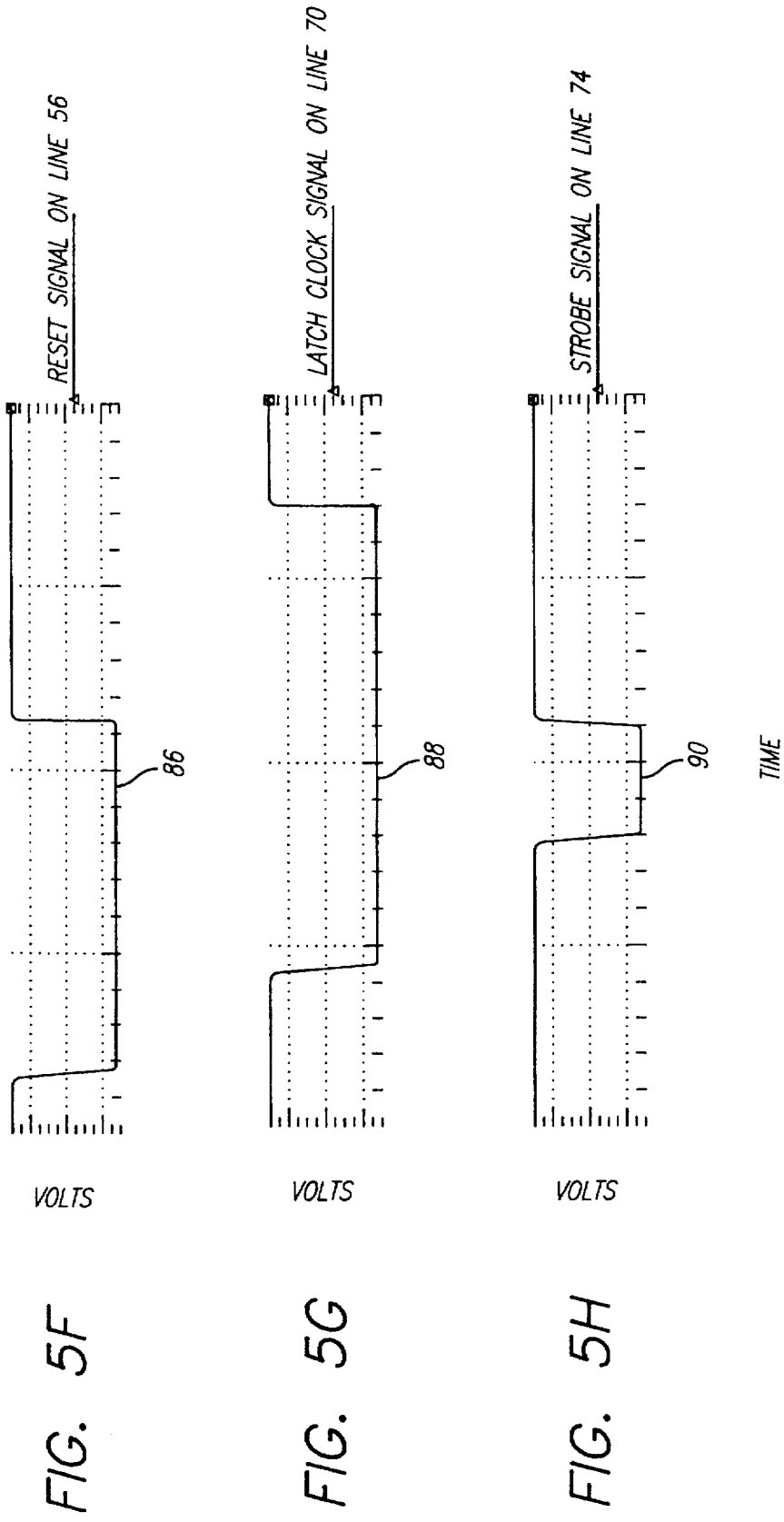

FIG. 6

| OUTPUT LINE | OUT VALUE | VOLTAGE OUTPUT | IN VALUE | OUTPUT LINE | VOLTAGE OUTPUT | DIGITAL VALUE |
|---|---|---|---|---|---|---|
| 21a | 0 | 21a | 0 | 28a | 0 | 111 |
| 44a | 1 | 42b | 1 | | | |
| | | | | 28b | 0 | 110 |
| 21b | 0 | 21b | 0 | | | |
| 44b | 1 | 44a | 1 | | | |
| | | | | 28c | 1 | 101 |
| 21c | 1 | 21c | 1 | | | |
| 44c | 0 | 44b | 1 | | | |
| | | | | 28d | 0 | 100 |
| 21d | 0 | 21d | 0 | | | |
| 44d | 1 | 44c | 0 | | | |
| | | | | 28e | 0 | 011 |
| 21e | 0 | 21e | 0 | | | |
| 44e | 1 | 44d | 1 | | | |
| | | | | 28f | 0 | 010 |
| 21f | 0 | 21f | 0 | | | |
| 44f | 1 | 44e | 1 | | | |
| | | | | 28g | 1 | 001 |
| 21g | 1 | 21g | 1 | | | |
| 44g | 0 | 44f | 1 | | | |
| | | | | 28h | 1 | 000 |
| 21h | 1 | 21h | 1 | | | |
| 44h | 0 | | | | | |

ERROR CORRECTING DECODER

This invention relates to a flash type of analog-to-digital converter. More particularly, this invention relates to flash types of analog-to-digital converters which provide a greater resolution in a shorter period of time than in the prior art and which minimize errors resulting from noise.

In flash types of analog-to-digital (A-D) converters of the prior art, an analog input value is converted to a digital value indicative of the analog input value. As a first step, the analog input value is provided as an analog input voltage. An analog reference voltage is also provided and is divided as by a resistance ladder network into a plurality of progressive fractions of the reference voltage. The input voltage is then compared in each comparator with an individual one of progressive fractions of the input voltage. In the prior art, first and second logic outputs are produced from each comparator with output values depending upon whether the magnitude of the input voltage is greater than, or less than, the magnitude of the individual one of the progressive fractions of the reference voltage. The first output from each individual comparator and the second output from the next higher comparator in the sequence of responding to the progressive fractions of the reference voltage network are then introduced to a logical network which produces an output depending upon the relative values of its inputs. Ideally, only one of the logical networks provides an output. The output from this logical network is converted in the prior art to a digital code representative of the input voltage.

Input voltages in consecutive operations of the converters of the prior art may be uniformly distributed in amplitude between the voltages associated with successive contacts in the reference voltage resistance ladder network. The voltages between successive pairs of contacts may have magnitudes in the order of a few millivolts. In order to provide an accurate conversion of the input voltage to a corresponding digital code, regenerative amplification of the input voltage is provided. When the input voltage is considerably removed from one of the voltage taps in the ladder network, the comparator associated with that tap in the ladder network resolves relatively quickly, requiring just a few regenerative time constants to indicate whether the magnitude of the input voltage is less than, or greater than, the magnitude of the individual fraction of the reference voltage at that tap.

Sometimes, however, the input voltage is very close to the fraction of the reference voltage on an individual one of the taps in the ladder network. Under such circumstances, a considerable number of regenerative time constants may be required before the comparator associated with that individual one of the taps will be able to resolve whether the input voltage is greater than, or less than, the reference voltage at that tap. As will be appreciated, this significantly slows the response of the converter if accurate indications from the converter are desired.

Since the comparator is a positive feedback device, its operation can be characterized by a regeneration time constant. In video applications, it is common to wait as many as fifteen (15) time constants before examining, or strobing, the comparator output. This is to give the comparator sufficient time to resolve. If the regeneration time constant of the comparator is two nanoseconds (2 ns), for example, it is common to wait thirty nanoseconds (30 ns) for each comparator to resolve.

In fifteen (15) time constants, an input signal will regenerate to approximately 3.3 million times its original value. If a comparator output of thirty three millivolts (33 mv) is large enough to produce an unambiguous result, the input voltage required to produce this result in fifteen (15) time constants is approximately one hundredth of a microvolt (0.01 µV)— or only ten nanovolts (10 nV). Sometimes the comparator has an input voltage gain such as a gain of five (5). Under such circumstances, the corresponding input voltage will be only two nanovolts (2 nV).

In flash converters where the magnitude of the reference voltage between successive taps in the ladder network is as small as two millivolts (2 mV), the probability of finding the magnitude of an input voltage of two nanovolts (2 nV) to two millivolts (2 mV) when this input voltage magnitude is within two nanovolts (2 nV) of a reference voltage at one of the taps in the ladder network is the ratio. This is one (1) part in a million (1,000,000). This means that, for a randomly distributed input signal, it will be within two nanovolts (2 nV) of the reference tap voltage only one (1) time in every million (1,000,000).

In video systems, an error rate of one (1) per million picture elements (pixels) is acceptable. In other kinds of data transmission systems such as telecommunications systems, error rates have to be less than one (1) per hour. If such a system required five (5) flash samples at a system clock rate of two million samples per second (2,000,000/sec), the acceptable error rate would be less than one in 36 trillion samples. This would require a waiting time considerably longer than fifteen (15) time constants in order for each comparator to resolve accurately when the input voltage has a magnitude close to one of the taps in the resistance ladder network for the reference voltage. If each regeneration time constant is two nanoseconds (2 ns), it would require a waiting period considerably longer than thirty (30) nanoseconds to achieve an acceptably low system error rate.

A long waiting time to produce an accurate conversion of an input voltage to a digital value is only one of the problems in the flash types of A-D converters now in use. Random noise can also be a significant source of errors in a series of comparators in a flash converter. The random noise in effect provides a pseudo input signal that is superimposed on the real system input to each comparator. The analog magnitudes of the noise signal and the real input signal are combined by addition, with the result that a comparator located one position below the one producing a valid "one" output, may cause a second "one" output from the logical network by producing a noise-induced "zero" at its first output.

The result is the superposition of the logical "ones" from the two (2) logical network outputs and the presentation of the combination at the output of the converter. When the converter is used in video applications, the combined binary signal, commonly known as a "superposition code", produces a high output value or bright spot on the video screen. This bright spot is known as "sparkle". It constitutes an annoyance on the video screen. Furthermore, when the converter is used in data applications, the combined signal represents inaccurate data.

Attempts have been made in prior art logical networks to reduce the effects of noise. For example, instead of connecting to a logical network the first output from only one comparator and the second output from the next highest comparator in the sequence, the second outputs from two or three comparators consecutive in the sequence to such next highest comparator are also connected to the logical network. Such connections are made to allow noise generated by such higher comparators to produce only one output from the logical network. This arrangement is generally adequate in a video system. One reason is that most of the noise is eliminated by this arrangement. For example, an acceptable statistical frequency of a noise output from such a system would be less than one (1) noise output in a million (1,000,000) outputs. However, this noise rate would not be acceptable in a high quality data transmission system.

This invention provides a system which overcomes the disadvantages discussed above. The system allows an input voltage to be resolved in a relatively short time such as five (5) time constants. In this short time, the system provides a resolution of the input voltage that is comparable to that which prior art systems are able to provide in a lengthened period such as fifteen (15) time constants. The system of this invention also substantially reduces the probability that noise, even of relatively high amplitude, will result in an output from more than one of the logical networks. The system of this invention provides such high resolution and such low noise with a minimal addition of components.

In one embodiment of the invention, the magnitudes of an input voltage and individual ones of progressive fractions of a reference voltage are compared to produce first and second output voltages de pendent upon the comparison results. Each of the elements in a first logical network receives a first output voltage from an individual one of the comparators and a second output voltage from a comparator non-consecutive with such individual one of the comparators (preferably connected to a reference tap that is two (2) taps above the tap for such individual one of the comparators. Signals from these elements pass to latches that are that are transparent in a first operating mode.

The latches have assertion and negation outputs which pass to elements in a second logical network. When an individual one of the elements in the second logical network provides a particular output, it prevents the elements receiving outputs from comparators responsive to lower reference voltage fractions than such individual element from providing the particular output.

In this way, only the element in the second logical network responsive to the highest reference voltage fraction within the preset time provides an output after the latches are rendered transparent by a second clocking signal. This element is strobed by a third clocking signal at a preset time to provide an output indicating the input voltage magnitude.

When an element in the second logical network responsive to a latch output resulting from a higher reference voltage fraction than that of the individual element provides an output within the preset time , its output supersedes that of the individual element and prevents elements in such logical network associated with lower reference voltage fractions from responding.

IN THE DRAWINGS

FIG. 1b is a chart illustrating another example of an operation of the prior art converter shown in FIG. 1 in providing a conversion of an analog value to a corresponding digital value, the example in FIG. 1b differing from the example in FIG. 1a in including the effects of a noise signal on the operation of the converter;

FIG. 2b is a chart illustrating another example of an operation of the prior art converter shown in FIG. 2 in providing a conversion of an analog value to a corresponding digital value, the example shown in FIG. 2b differing from the value shown in FIG. 2a in including the effects of a noise signal on the operation of the converter;

FIG. 3a is a chart illustrating an example of an operation of the converter shown in FIG. 3 in providing a conversion of an analog value to a corresponding digital value;

Figure 3:
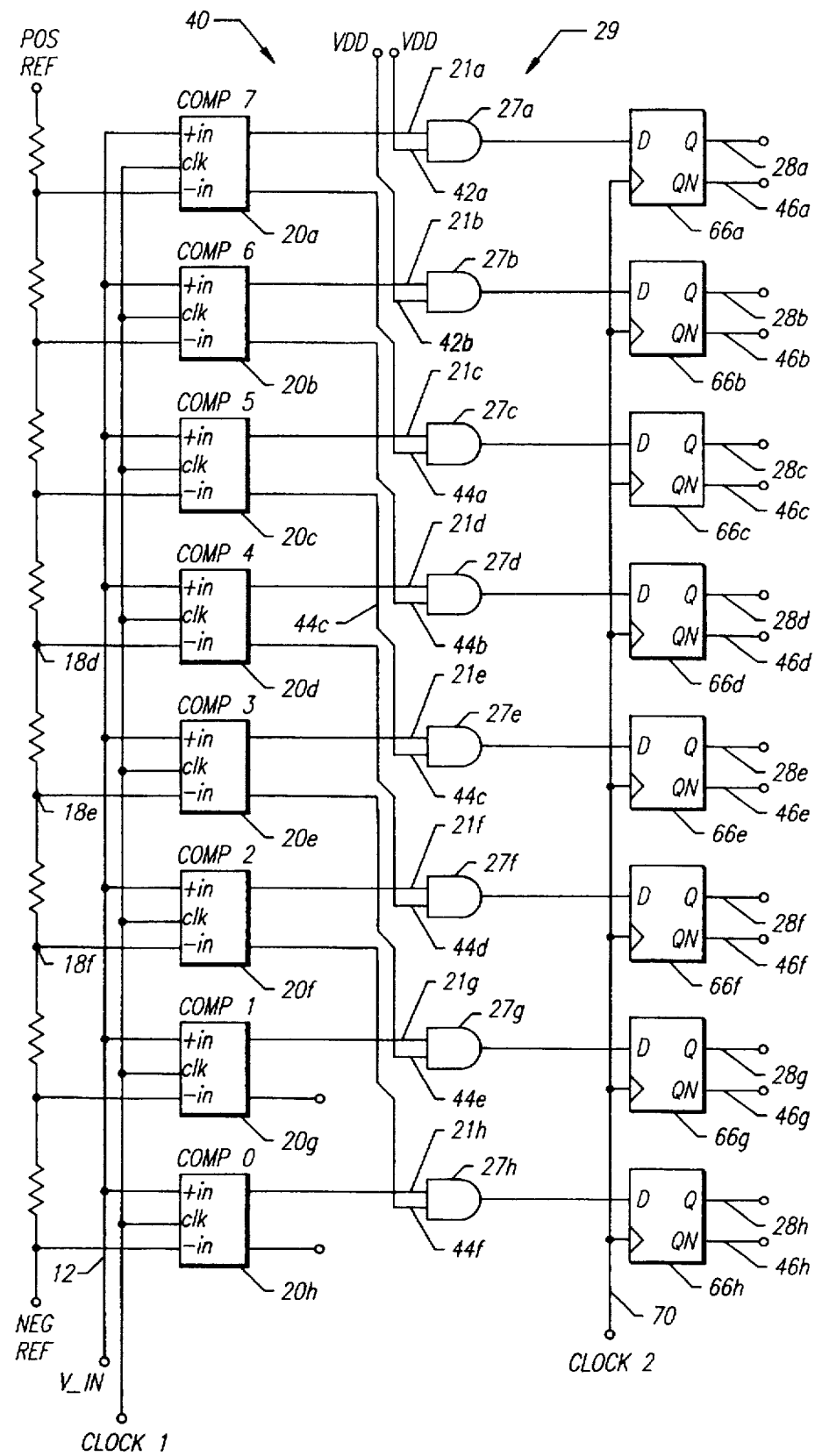
FIG. 3 is a circuit diagram, partly in block form, of an improved flash type of analog-to-digital converter constituting one embodiment of the invention.
Figure 4:
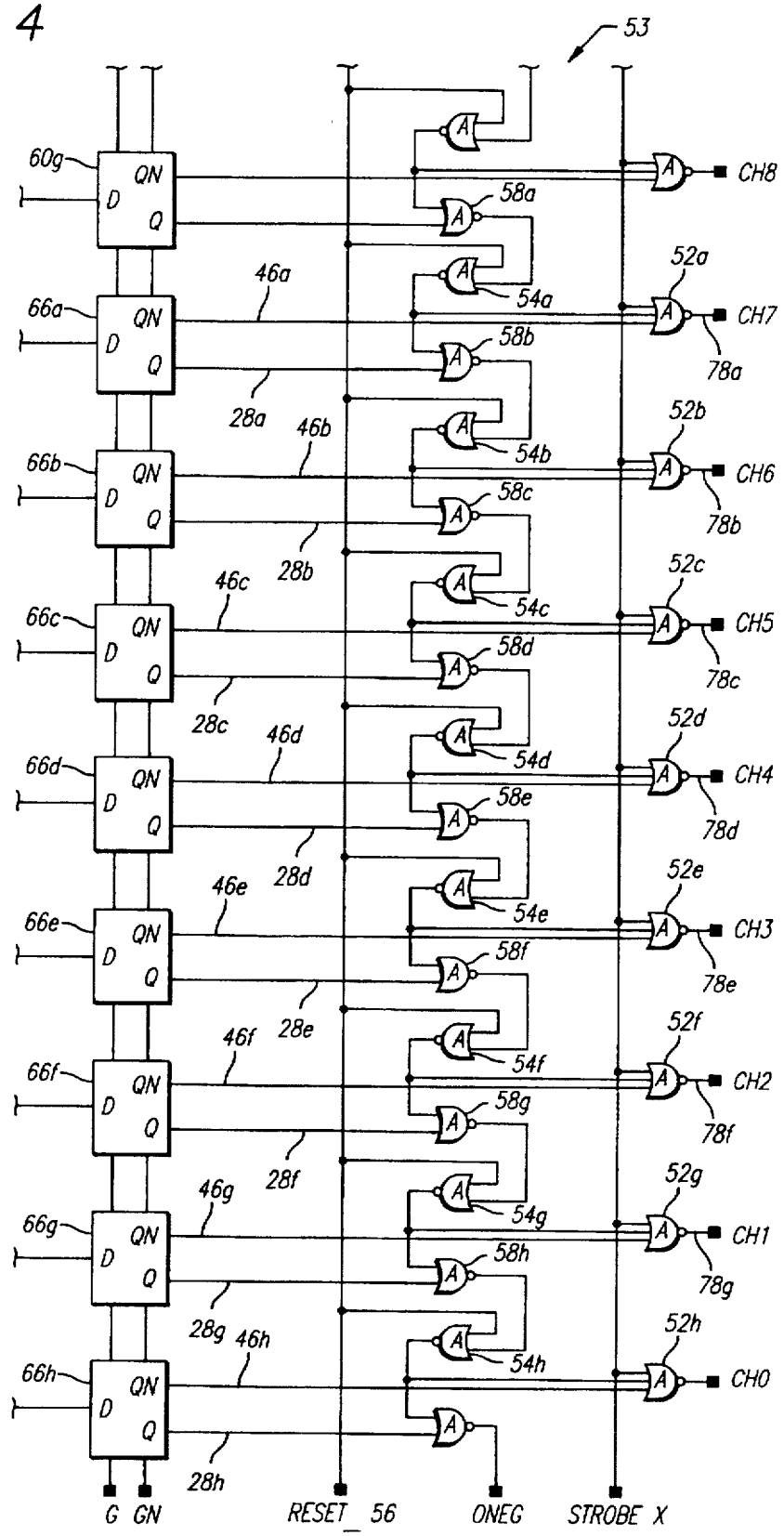
FIG. 4 is a circuit diagram, partially in block form, of improvements which are used in combination with the converter shown in FIG. 3 in enhancing the operation of the converter constituting one embodiment of the invention.

FIGS. 5A–5H illustrate voltage waveforms produced at strategic terminals in the embodiment shown in FIGS. 3 and 4 when this embodiment is operating in accordance with the example shown in FIG. 3a; and FIG. 6 is a chart illustrating another example of the operation of the embodiment shown in FIGS. 3 and 4 in providing a conversion of an analog value to a corresponding digital value, the example in FIG. 6 differing from the example in FIG. 3a in including the effects of a noise signal on the operation of the converter.

Figures 1, 1A:
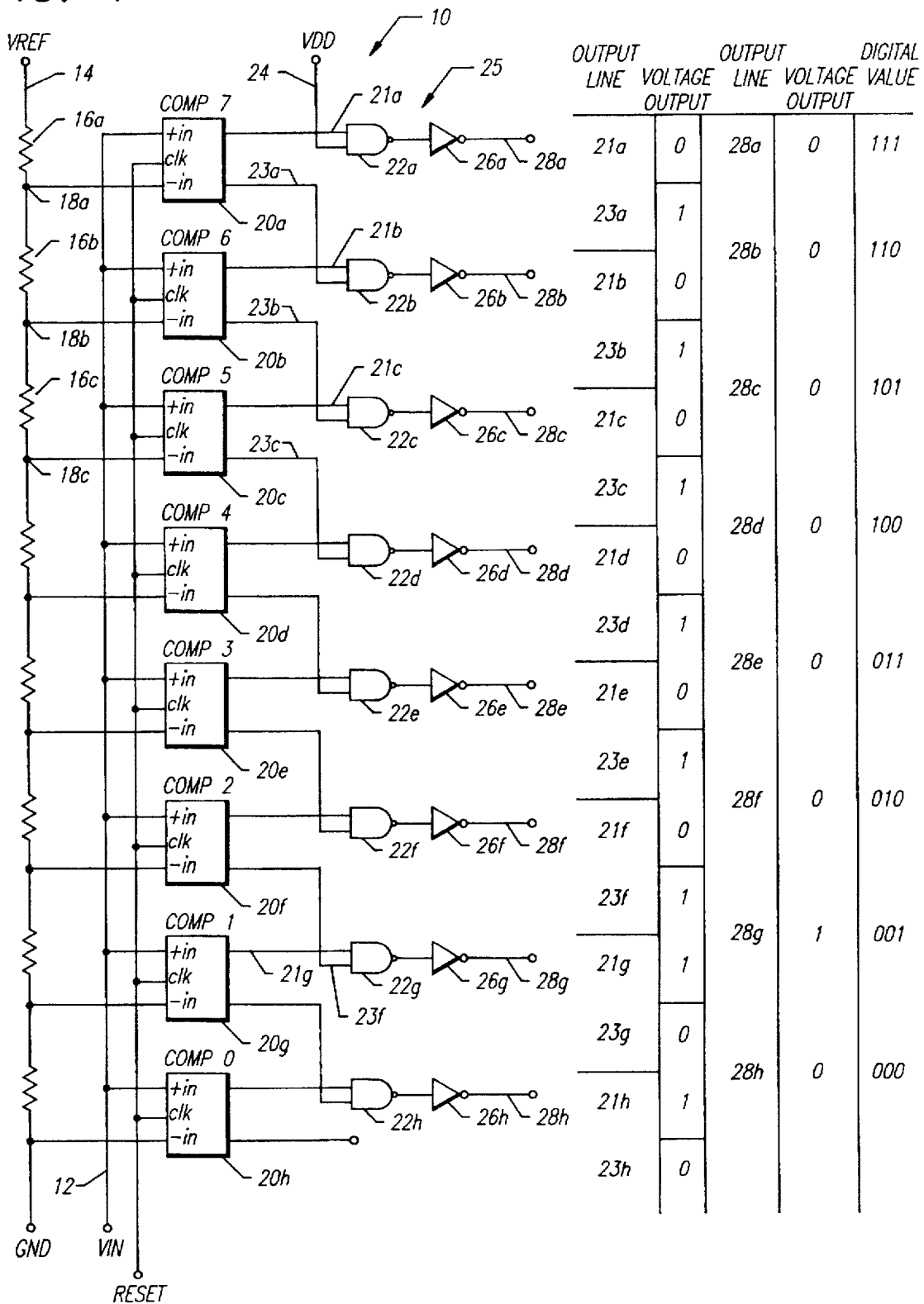
FIG. 1 is a circuit diagram, partially in block form, of a flash type of analog-to-digital converter of the prior art.
FIG. 1a is a chart illustrating one example of an operation of the prior art converter shown in FIG. 1 in providing a conversion of an analog value to a corresponding digital value.

FIG. 1 generally illustrates at 10 a prior art embodiment of a flash type of analog-to-digital (A-D) converter. The converter 10 includes a line 12 which receives an input voltage (VIN) whose magnitude is to be determined and converted to a corresponding digital voltage. A line 14 receives a reference voltage (VREF). A plurality of resistors 16a, 16b, 16c, etc., preferably of equal value, are connected in a series (or ladder) network to provide progressive fractions of the reference voltage at terminals or taps 18a, 18b, 18c, etc.

The voltage on the line 12 is introduced to a first input terminal in each of a plurality of comparators 20a, 20b, 20c, etc., which may be constructed in a conventional manner. Second input terminals of the comparators 20a, 20b, 20c, etc. respectively receive individual ones of the progressive fractions of the reference voltages on the taps 18a, 18b, 18c, etc. First input terminals of elements 22a, 22b, 22c, etc. such as NAND gates respectively receive the outputs on first output lines 21a, 21b, 21c, etc. from the comparators 20a, 20b, 20c, etc.

The elements 22a, 22b, 22c etc. are respectively included in a logical network generally indicated at 25. A second input terminal of the element 22a receives an energizing voltage VDD on a line 24. Second input terminals of the elements 22b, 22c, etc. are respectively connected to second output lines 23a, 23b, etc. from the comparators 20a, 20b, etc. Connections are respectively made from the output terminals of the elements 22a, 22b, 22c, etc. in the logical network 25 to input terminals of inverters 26a, 26b, 26c, etc. The outputs from the inverters 26a, 26b, 26c, etc., are respectively provided on lines 28a, 28b, 28c, etc.

Each of the comparators 20a, 20b, 20c, etc. compares the magnitude of the input voltage (VIN) on the line 12 and an individual one of the progressive fractions of the reference voltage (VREF) on the line 14. When the input voltage is greater than the individual one of the progressive fractions of the reference voltage on the taps 18a, 18b, 18c, etc., the individual one of the comparator s 20a, 20b, 20c, etc. produces an output voltage on the individual one of the lines 21a, 21b, 21c, etc. However, when the input voltage on the line 12 is less than the individual one of the progressive fractions of the reference voltage on the taps 18a, 18b, 18c, etc., the individual one of the comparators 20a, 20b, 20c, etc. produces an output voltage on the individual ones of the lines 23a, 23b, 23c, etc.

The elements 22a, 22b, 22c, etc. in the logical network 25 receive the first outputs respectively from individual ones of the comparators 20a, 20b, etc., with the second outputs 23a, 23b, etc., from the consecutive ones of the comparators 20a, 20b, etc. being introduced respectively to individual ones of the elements 22b, 22c, etc. Each of the elements 221a, 22b, 22c, etc. in the logical network 25 produces an output when both inputs to such element provide a logical "1".

FIG. 1a provides an illustration of the operation of the converter shown in FIG. 1. A first column in FIG. 1a designates the output lines 21a and 23a from the comparator 20a, the output lines 21b and 23b from the comparator 20b and the output lines 21c and 23c from the comparator 20c, etc. A second column in FIG. 1a indicates whether the outputs on the lines 21a and 23a, 21b and 23b, 21c and 23c, etc. are respectively a binary 1 or a binary 0. A third column in FIG. 1a indicates the output lines 28a, 28b, 28c, etc. A fourth column in FIG. 1a indicates whether a binary 1 or a binary 0 appears on the respective ones of the output lines 28a, 28b, 28c, etc. A fifth column in FIG. 1a indicates the digital value of the output lines 28a, 28b, 28c, etc.

As will be seen in FIG. 1a, a binary 1 is simultaneously provided on the lines 23f and 21g to indicate that the input voltage is greater than the reference voltage in the comparator 20g but is less than the reference voltage in the comparator 20f. An output voltage indicative of a binary 1 is accordingly produced on the line 28g. This output voltage is converted by stages well known in the art into a binary number representative of the value of the input voltage on the line 12 causing the binary 1 on the line 28g. For example, a binary number of 001 results from a "one" on the line 28g.

The converter 10 shown in FIG. 1 and described above operates satisfactorily under ideal conditions. However, when the magnitude of the input voltage on the line 12 is close to the magnitude of the reference voltage on one of the taps 18a, 18b, 18c, etc., the converter 10 requires a long time to resolve satisfactorily in providing an accurate indication of the reference voltage. Furthermore, the converter 10 does not eliminate the effects of noise. This may be seen from the example illustrated in FIG. 1b.

In FIG. 1b, the true output indication of the input voltage on the line 10 is indicated on the line 28g as in FIG. 1 a. However, a noise output indication is simultaneously produced on the line 28d as indicated by two (2) binary 1's in the second column and by a binary 1 in the fourth column of FIG. 1b. The prior art embodiment shown in FIG. 1 does not eliminate the effects of the noise signal on the line 28d. Because of this, the binary output from the converter 10 in the example shown in FIG. 1b will be the superposition of binary out put codes resulting from the outputs on the lines 28d and 28g. This is equivalent to an output on a line, such as the line 28c, higher in the sequence than the lines 28d and 28g. As will be appreciated, this output is considerably greater than the true output on the line 28g. It results in bright spots on the video screen. These bright spots are generally designated as "sparkle".

Figures 2, 2A:
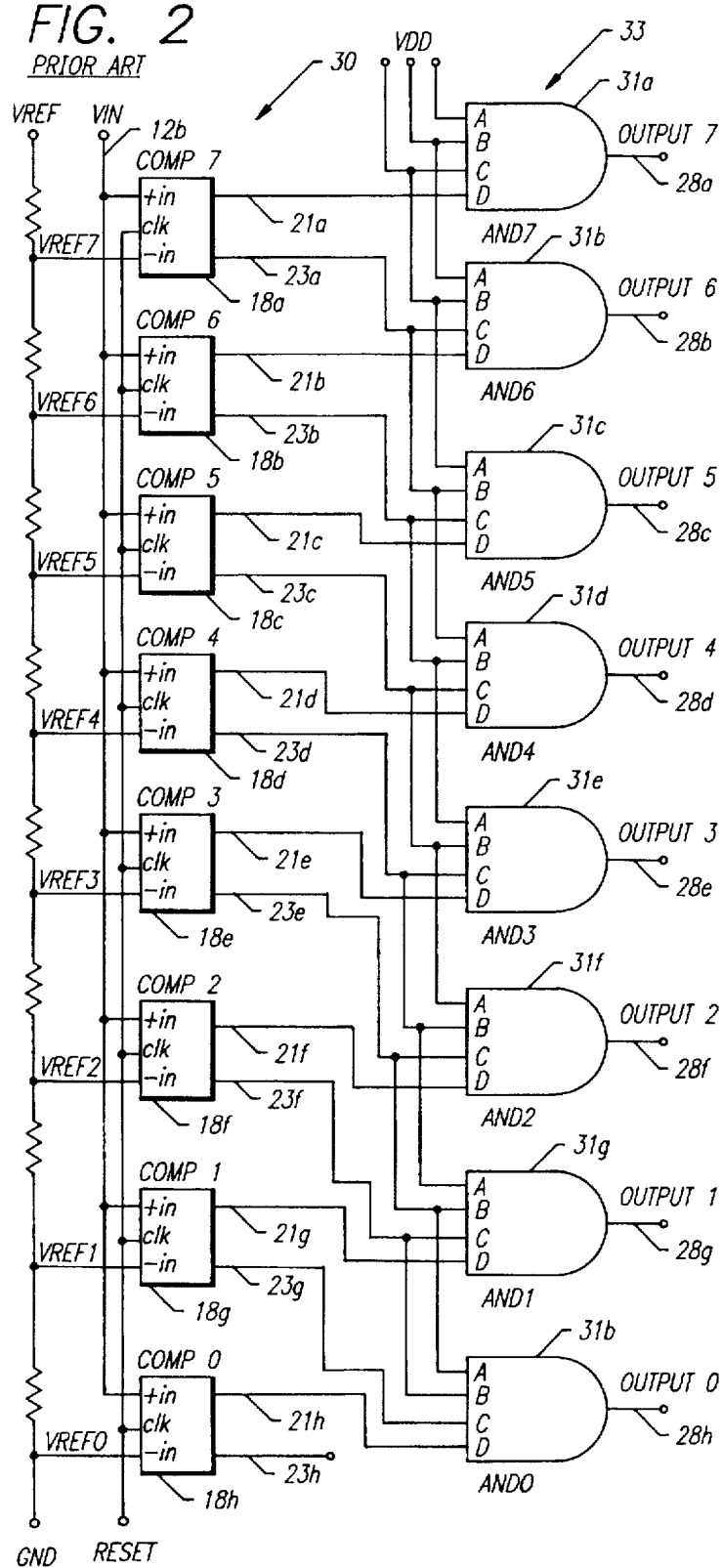
FIG. 2 is a circuit diagram, partially in block form, of an improved embodiment of a flash type of analog-to-digital converter of the prior art.
FIG. 2a is a chart illustrating one example of an operation of the prior art converter shown in FIG. 2 in providing a conversion of an analog value to a corresponding digital value.

FIG. 2 generally illustrates at 30 another embodiment of a converter in the prior art. The converter 30 in FIG. 2 is similar in many respects to the converter 10 in FIG. 1 and is accordingly provided, for the same components in FIGS. 1 and 2, with the same numerical designations as the converter 10 shown in FIG. 1. However, elements 31a, 31b, 31c, etc., in FIG. 2 receive a greater number of inputs from the comparators 20a, 20b, 20c, etc. than the elements 22a, 22b, 22c, etc. shown in FIG. 1. For example, the element 31d receives the output on the line 21d from the comparator 20d and the outputs on the lines 23a, 23b and 23c respectively from the comparators 20a, 20b and 20c. The elements 31a, 31b, 31c, etc., are included in a logical network generally indicated at 33 in FIG. 2.

In the example shown in FIG. 2a, a binary 1 output is produced on the line 28e (see FIG. 1) to indicate the magnitude of the input voltage on the line 12. This is indicated in the third (3d) column of FIG. 2a. This binary voltage is produced because binary values of 1 are produced on the lines 21e and 23b, 23c and 23d. As will be appreciated, a signal will not be produced on the line 28e if a noise signal is simultaneously produced on one of the lines 21b, 21c and 21d. In this way, the prior art embodiment shown in FIG. 2 has a beneficial, but limited, effect in preventing noise from affecting the output of the converter 30.

FIG. 2b illustrates an example where the converter 30 of FIG. 2 is not operative in eliminating the effects of a noise signal in the converter. As shown in FIG. 2b, a true output is produced on the line 28g because of simultaneous productions of a binary 1 on the line 21g and the lines 23d, 23e and 23f. However, another output is simultaneously produced on the line 28c to represent noise because of the simultaneous production of a binary 1 on the line 21c and the lines 23a and 23b and the voltage VDD. The resultant output from the converter 30 is a superposition of the outputs on the lines 28c and 28g.

The converter shown in FIG. 3 and generally indicated at 40 constitutes one embodiment of the invention. The converter 40 is similar to the prior art converter shown in FIG. 1 except for the connections to the elements 22a, 22b, 22c, etc., in the first logical network 25 in FIG. 1. As in the prior art embodiment shown in FIG. 1, the lines 21a, 21b, 21c, etc. from the comparators 20a, 20b, 20c, etc., are respectively connected in FIG. 3 to first terminals of elements 27a, 27b, 27c, etc. in a first logical network generally indicated at 29. However, connections are respectively made in FIG. 3 from the second output terminals of the comparators 20a, 20b, 20c, etc., through lines 44a, 44b, 44c, etc., to the second input terminals of the elements 27c, 27d, 27e, etc., in the logical network 29. Lines 42a and 42b are connected from the supply voltage VDD to the second input terminals of the elements 27a and 27b. The elements 27a, 27b, 27c, etc. in the logical network 29 are similar to the elements 22a, 22b, 22c, etc., in the logical network 29 except that they constitute AND gates rather than NAND gates .

As will be seen, each of the elements 27c, 27d, etc. in the first logical network 29 receives the second output from a non-consecutive comparator. This non-consecutive comparator is connected to a higher fraction of the reference voltage than the next higher consecutive comparator typical of the prior art. For example, the element 27e receives the second output through the line 44c from the comparator 20c rather than through the line 44d from the comparator 20d. This provides a faster and more stable response than in the prior art. This may be seen from a particular example. For example, assume that the magnitude of the input voltage on the line 12 is close to the magnitude of the reference voltage on the tap 18d. This would cause the comparator 20d in FIG. 1 to be metastable and to require a large number of time constants to resolve an accurate output from the comparator.

By connecting the second output of the comparator 20c to the element 27e in the logical network 29 instead of connecting the second output of the comparator 20*d* to the element 27*e*, the element 27*e* responds to the comparators 20*c* and 20*e*. Both of the comparators 20*c* and 20*e* have input differential voltage magnitudes which are approximately equal to the reference voltage increment between successive ones of the taps 18*a*, 18*b*, 18*c*, etc. This causes the element 22*e* to resolve in a relatively short time such as less than five (5) regeneration time constants. By connecting the element 27*e* to the comparators 20*c* and 20*e*, it is not necessary to wait for a comparator in a metastable state, such as the comparator 20*d* in the above example, to resolve in order to obtain a high accuracy from the system shown in FIG. 3.

There is some probability that one of the comparators above or below the metastable one (e.g. the comparator 20*d* in the example of the previous paragraph) will also be metastable as a result of noise present at the input. This event will occur with a statistical rarity predicted by the joint probability that input voltage plus noise on two (2) comparators will be in just the required range of that voltage distribution to place both comparators in a metastable state at one time. Under such circumstances, in order for both comparators to be metastable, the input to each of the comparators (e.g. the comparators 20*d* and 20*e* in the example of the previous paragraph) has to be less than one millionth ($1/1,000,000$) of the voltage increment between successive pairs of the taps 18*a*, 18*b*, 18*c*, etc. The joint probability of this occurring simultaneously in the comparators 20*a* and 20*e* is less than ($1/1,000,000$).($1/1,000,000$) or less than $1/1,000,000,000,000$.

FIG. 3*a* illustrates an example of the operation of the flash type of converter 40 shown in FIG. 3. In FIG. 3*a*, the first column shows the upper and lower output lines from the comparators 20*a*, 20*b*, 20*c*, etc. in FIG. 3. The second column in FIG. 3*a* indicates the binary output values on these lines in an example which will be discussed below. The third column in FIG. 3*a* indicates how these output lines are paired in the input lines to logical networks 27*a*, 27*b*, 27*c*, etc. in the converter 40 of FIG. 3. The fourth column in FIG. 3*a* indicates the binary values of the signals on the paired lines introduced to the logical networks 27*a*, 27*b*, 27*c*, etc. The fifth column in FIG. 3*a* designates the individual ones of the elements 27*a*, 27*b*, 27*c*, etc. receiving the binary inputs shown in the fourth column of FIG. 3*a*. The sixth column indicates the logic level outputs from the individual ones of the elements 27*a*, 27*b*, 27*c*, etc., in the logical network 29. As will be seen, a binary output of 1 is obtained from two logical networks 27*f* and 27*g* in the example shown in FIG. 3*a*.

The outputs from the logical network elements 27*a*, 27*b*, 27*e*, etc in the logical network 29 are respectively connected to latches 66*a*, 66*b*, 66*c*, etc. in FIG. 3. In a first mode, the latches are transparent to the "D" input signals from the elements 27*a*, 27*b*, 27*c*, etc. in the logical network 29. In the transparent mode, the "D" input signals to the latches are respectively passed to the latch "Q" outputs 28*a*, 28*b*, 28*c*, etc. (also shown in FIG. 1) of the latches 66*a*, 66*b*, 66*c*, etc.

The negations or "QN" outputs of the latches are indicated at 46*a*, 46*b*, 46*c*, etc. The Q and QN output signals from the latches 66*a*, 66*b*, 66*c*, etc. are held or latched into a constant logical state when an input clock signal, CLOCK 2, is driven from 1 to 0. This occurs at a time preferably a few nanoseconds (e.g. 2–10 ns) after the outputs from the comparators 20*a*, 20*b*, 20*c*, etc. are decoded by the elements 27*a*, 27*b*, 27*c*, etc., in the logical network 29.

The latches 66*a*, 66*b*, 66*c*, etc. and the lines 28*a*, 46*a*, 28*b*, 46*b*, 28*c*, 46*c*, etc., shown in FIG. 3 are also shown in FIG.

4. The lines 46*a*, 46*b*, 46*c*, etc. are connected to first terminals in elements 52*a*, 52*b*, 52*c*, etc., in a logical network generally indicated at 53. The elements 52*a*, 52*b*, 52*c*, etc., may be NOR gates. Connections are respectively made from the lines 28*a*, 28*b*, 28*c*, etc., to first terminals in elements 58*a*, 58*b*, 58*c*, etc., which are also included in the logical network 53. The elements 58*a*, 58*b*, 58*c*, etc., may be NOR gates.

Second input terminals in the elements 58*a*, 58*b*, 58*c*, etc. and second input terminals in the elements 52*a*, 52*b*, 52*c*, etc., are common with the output terminals of elements 54*a*, 54*b*, 54*c*, etc., which are also included in the logical network 53. The elements 54*a*, 54*b*, 54*c*, etc., may be NOR gates. Input terminals of the elements 54*a*, 54*b*, 54*c*, etc. are common with a reset line 56 and respectively with a NOR gate 60 and with the output terminals of the NOR gates 58*a*, 58*b*, etc. A third input terminal of the elements 52*a*, 52*b*, 52*c*, etc., in the logical network 53 is common with a strobe line 74. The outputs of the elements 52*a*, 52*b*, 52*c*, etc., are respectively provided on lines 78*a*, 78*b*, 78*c*, etc.

In the example shown in FIG. 3*a*, the element 27*f* output in FIG. 3 provides a binary 0 output to the line 46*f* shown in FIGS. 3 and 4. The element 52*f* in FIG. 4 inverts the binary 0 signal on the line 46*f* to a binary 1. At the same time that the element 66*f* provides the binary 0 output on the line 46*f*, it provides a binary 1 output on the line 28*f*. This binary 1 output forces a binary 0 output in the element 58*g* and the binary 0 output from the element 58*g* is converted to a binary 1 output from the element 54*g*. When a binary 1 is output from the element 54*g* and introduced to the element 52*g* in the logical network 53, it forces a binary 0 output from the element 52*g*.

In this way, the element 52*g* is prevented from providing an output regardless of the value of the binary output that passes on the line 46*g* to the element 52*g*. As a result, no signal can be provided from any of the elements lower in value than the element 52*f* when the element 52*f* provides a binary 1 output. This results from the clamp provided by the elements in the sequence beginning with 58*g* and 54*g* and lower. As a result, the logical network 53 is not affected by real signals or noise in any of the elements lower in value than the element 52*f*.

A logic 1 signal is provided on the reset line 56 in FIG. 4 at the beginning of each cycle to reset the NOR gates 54*a*, 54*b*, 54*c*, etc., so that a new operation as described above can be initiated in each clock cycle. By providing the reset signal in each clock cycle, all of the elements 54*a*, 54*b*, 54*c*, etc., are set to the same value at the beginning of such clock cycle until a binary 1 is produced on one of the lines 28*a*, 28*b*, 28*c*, etc., in that clock cycle.

A logic 0 strobe signal is produced on the line 74 at the end of each clock cycle to strobe the elements 52*a*, 52*b*, 52*c*, etc. to allow the output lines 78*a*, 78*b*, 78*c*, etc., to assume a value other than binary 0 during the strobe signal. The output from the elements 52*a*, 52*b*, 52*c*, etc., is taken on the lines 78*a*, 78*b*, 78*c*, , during the strobe signal on the line 74.

It will be appreciated that one of the elements 66*a*, 66*b*, 66*c*, etc., indicative in the network 53 of a higher magnitude of the input voltage than the element 66*f* may resolve and produce a binary 1 output after the element 66*f* has resolved and produced a binary 1 output. For example, the element 66*d* in the logical network 53 may resolve and produce a binary 1 output at 28*d* after the element 66*f* has resolved and produced a binary 1 output at 28*f*. When this occurs before the strobe line 74 produces a signal in that clock cycle, the binary 0 output on the line 46*d* produces a binary 1 output from the element 52d during the strobe. This causes a binary 1 output to be produced on the line 78d in the logical network 53.

At the same time that the binary 0 output is produced on the line 46d, a binary 1 output is produced on the line 28d. This binary 1 output passes in progressively inverted form through the chain defined by the elements 58e, 54e, 58f, 54f, 58g, 54g, 58h and 54h to force binary 0 outputs from the elements 52e, 52f, 52g, and 52h. In this way, a binary 0 output is provided on all of the output lines lower in binary value than the output line 78d.

Figure 5A:
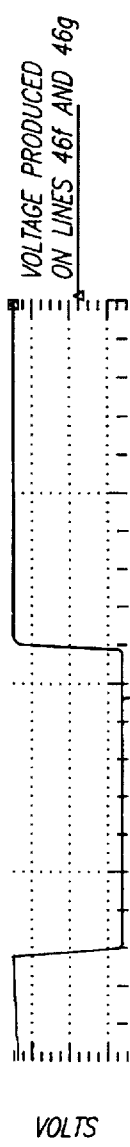
Figure 5B:
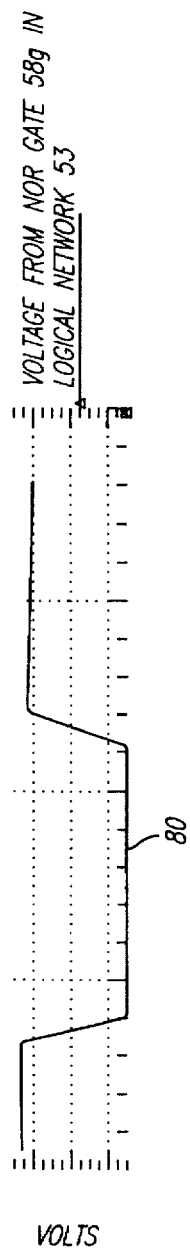
Figure 5C:
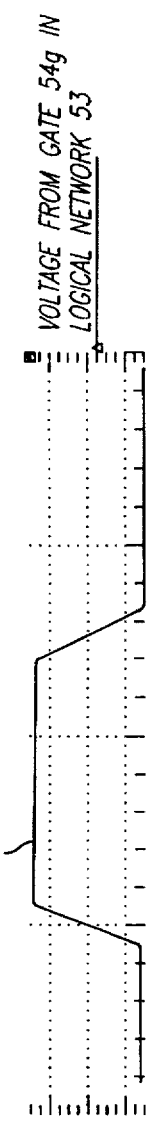

FIGS. 5A–5H illustrate voltage waveforms at strategic terminals in the embodiment shown in FIGS. 3 and 4. FIG. 5A illustrates a voltage 71 produced on the lines 46f and 46g when a binary output is provided by the element 52f in the logical network 53. The 46f logic level is inverted by the element 52f as illustrated at 72 in FIG. 5E and the inverted level is introduced as a binary 1 to the line 78g. FIG. 5B illustrates a voltage 80 from the element 58g and FIG. 5C illustrates a voltage 82 from the element 54g in the logical network 53.

Figure 5D:
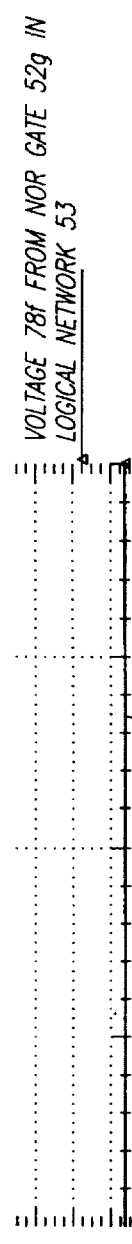
Figure 5E:
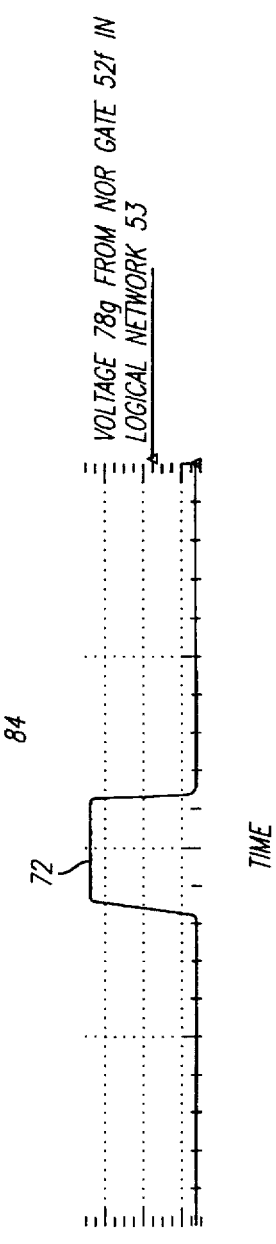

FIG. 5D illustrates at 84 the voltage 78g from the element 52g in the logical network 53. As will be seen, no output is provided from the element 52h because an output is inhibited from all of the stages lower in the logical network 53 than the element 52f. The reset signal on the line 56 in FIG. 4 is illustrated at 86 in FIG. 5F and the latch clock signal on the line 70 in FIG. 3 is illustrated at 88 in FIG. 5G. FIG. 5H illustrates at 90 the strobe signal on the line 74 in FIG. 4.

The system disclosed above has certain important advantages. It provides an analog-to-digital conversion of an analog input voltage in a shorter time and with a higher resolution than in the prior art. It does this by providing inputs to each of the elements 27a, 27b, 27c, etc., in the logical network 29 in FIG. 3 from non-consecutive comparators. Preferably these non-consecutive comparators are separated by one comparator between the non-consecutive comparators providing the inputs to each individual one of the elements 27a, 27b, 27c, etc. Furthermore, it inhibits outputs from the elements 52a, 52b, 52, etc., in the logical network 53 lower than the highest particular one of the elements 52 providing the output. It provides such inhibition by including the elements 58a, 58b, 58c, etc. and 54a, 54b, 54c, etc. in the logical network 53 to inhibit outputs from such lower order ones of the elements 52a, 52b, 52c, etc. For example, the elements 58d, 54d, 58e, 54e, 58f, 54f operate to inhibit outputs lower in binary significance than the element 52c when the element 52c is selected to provide the output. In this way, the system inhibits the effect of noise in the output from the elements 52 in the logical network 53.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In a flash type of analog-to-digital converter,
means for providing an input voltage,
means for providing a reference voltage,
means including terminals for dividing the reference voltage into progressive increments in the reference voltage,
comparator means each operative to compare the relative magnitudes of the input voltage and the reference voltage at an individual one of the terminals, each of the comparator means having two output terminals one indicative of a first result in the comparison and the other indicative of an opposite result in the comparison, and
elements in a logical network, each of the elements being responsive to the voltage on the first output terminal of an individual one of the comparators and to the second output terminal of another comparator non-consecutive to the individual one of the comparators to provide the comparison of the input voltage to the progressive increments of the reference voltage, each of the elements being responsive to provide the comparison of the input voltage to the progressive increments of the reference voltage without being responsive to the output from the comparator consecutive with the individual one of the comparators.

2. In a flash type of analog-to-digital converter,
means for providing an input voltage,
means for providing a reference voltage,
means including terminals for dividing the reference voltage into progressive increments in the reference voltage,
comparator means each operative to compare the relative magnitudes of the input voltage and the reference voltage at an individual one of the terminals, each of the comparator means having two output terminals one indicative of a first result in the comparison and the other indicative of an opposite result in the comparison, and
elements in a logical network, each of the elements being responsive to the voltage on the first output terminal of an individual one of the comparators and to the second output terminal of another comparator non-consecutive to the individual one of the comparators in the comparison of the input voltage to the progressive increments of the reference voltage, and
means responsive to a particular output from each individual one of the elements in the logical network for preventing elements in the logical network of lower significance than the individual one of the elements from providing the particular output.

3. In a flash type of analog-to-digital converter,
means for providing an input voltage,
means for providing a reference voltage,
means including terminals for dividing the reference voltage into progressive increments in the reference voltage,
comparator means each operative to compare the relative magnitudes of the input voltage and the reference voltage at an individual one of the terminals, each of the comparator means having two output terminals one indicative of a first result in the comparison and the other indicative of an opposite result in the comparison, and
elements in a logical network, each of the elements being responsive to the voltage on the first output terminal of an individual one of the comparators and to the second output terminal of another comparator non-consecutive to the individual one of the comparators in the comparison of the input voltage to the progressive increments of the reference voltage, and
means responsive to a particular output from each individual one of the elements in the logical network for preventing all of such elements of lower significance than the individual one of the elements from providing the particular output.

4. In a flash type of analog-to-digital converter as set forth in claim 3, means for providing a strobe pulse, means operative after the particular output from the individual one of the elements in the logical network for obtaining the particular output from one of the elements in the logical network of higher significance than the individual one of the elements when the particular output from such element of higher significance occurs before such strobe pulse.

5. In a flash type of analog-to-digital converter, means for providing an input voltage, means for providing a reference voltage, means for dividing the reference voltage into progressive increments, comparing means each for comparing the input voltage and an individual one of the progressive increments in the reference voltage and for providing two (2) outputs one representing a first result in the comparison and the other representing an opposite result in the comparison, elements in a first logical network, each element being responsive to the one output from an individual one of the comparing means and the other output from one of the comparing means non-consecutive with the individual one of the comparing means for providing an output dependent upon the values of the outputs received from such comparing means, and elements in a second logical network, each of such elements being associated with an individual one of the elements from the first logical network for providing a particular output dependent upon the output from the individual one of the elements in the first logical network and being operative upon the occurrence of the particular output from such individual one of the elements in the second logical network for preventing elements in the second logical network of lower significance than such individual one of such elements in the second logical network from providing such particular output.

6. In a flash type of analog-to-digital converter as set forth in claim 5, each of the elements in the first logical network receiving the one (1) output from the individual one of the comparing means and receiving the other output from the comparing means receiving a progressive voltage increment removed from the progressive voltage increment by two (2) voltage increments to provide an output dependent upon the outputs received from such comparing means.

7. In a flash type of analog-to-digital converter as set forth in claim 6, each individual one of the elements in the second logical network being operative upon the particular output from the associated one of the elements in the first logical network for preventing the particular output from being provided by the elements in the second logical network of lower significance than the individual one of such elements in the second logical network.

8. In a flash type of analog-to-digital converter as set forth in claim 5, each of the elements in the first logical network receiving the one (1) output from the individual one of the comparing means and receiving the other output from one of the comparing means responsive to a voltage reference increment higher than the voltage reference increment introduced to the individual one of the comparing means and non-consecutive to the voltage reference increment introduced to the individual one of the comparing means to provide an output dependent upon the outputs received by such element.

9. In a flash type of analog-to-digital converter, means for providing an input voltage, means for providing a reference voltage, means for dividing the reference voltage into voltages each representing a progressive fraction of the reference voltage, comparing means each operative to compare the input voltage and an individual one of the progressive fractions of the reference voltage and to provide an output dependent upon such comparison, elements in a first logical network, each of such elements being operative to provide an output dependent upon the output of an individual one of the comparing means and the output of a particular one of the comparing means receiving a higher progressive fraction of the reference voltage than the comparing means next in sequence to the individual one of the comparing means in the ascending fractions of the reference voltage, and elements in a second logical network, each individual one of such elements being responsive to a particular output from an individual one of the elements in the first logical network for preventing such particular output from being obtained from other elements responsive in the second logical network to a lower progressive fraction of the reference voltage than such individual one of the elements in the second logical network.

10. In a flash type of analog-to-digital converter as set forth in claim 9, means for providing a strobe signal, means in the second logical network for providing for the production, before the production of the strobe signal, of the particular output from a second individual one of the elements in the second logical network responsive to a higher progressive fraction of the reference voltage than such individual one of such elements.

11. In a flash type of analog-to-digital converter as set forth in claim 10, means for preventing the individual one of the elements in the second logical network from providing the particular output when the second individual one of the elements in the second logical network provides the particular output before the occurrence of the strobe signal.

12. In a flash type of analog-to-digital converter as set forth in claim 11, each of the elements in the first logical network being operative to provide an output dependent upon the output of the individual one of the comparing means and upon the output of a particular one of the comparing means receiving a higher progressive fraction, each of the elements in the second logical network being responsive to the particular output from an individual one of the elements in the first logical network for preventing the particular output from being obtained from any of the elements responsive in the second logical network to lower progressive fractions of the reference voltage than such individual one of the elements in the second logical network.

13. In a flash type of analog-to-digital converter as set forth in claim 9, each of the elements in the first logical network including a latch for latching the particular output from such element, each of the elements in the second logical network including gates connected in a sequence from each of the elements in the second logical network to the elements of lower significance in the second logical network.

14. In a flash type of analog-to-digital converter as set forth in claim 13, each of the elements in the first logical network being operative to provide an output dependent upon the output of the individual one of the comparing means and upon the output of a particular one of the comparing means receiving a higher progressive fraction, displaced by one (1) in a non-consecutive relationship, of the reference voltage than the individual one of the comparing means, each of the elements in the second logical network being responsive to the particular output from an individual one of the elements in the first logical network for preventing the particular output from being obtained from any of the elements responsive in the second logical network to lower progressive fractions of the reference voltage than such individual one of the elements in the second logical network.

15. In flash type of analog-to-digital converter, means for providing an input voltage, means for providing a reference voltage, means for dividing the reference voltage into a plurality of voltages each representing a progressive fraction of the reference voltage, comparing means each operative to compare the input voltage and an individual one of the progressive fractions of the reference voltage and to provide an output dependent upon such comparison, first logical means each operative to provide an output dependent upon the output of an individual one of the comparing means and upon the output of a particular one of the comparison means non-consecutive with the individual one of the comparing means, the particular one of the comparing means being responsive to a fraction of the reference voltage greater than the fraction of the reference voltage to which the individual one of the comparing means responds, second logical means each operatively coupled to an individual one of the first logical means for preventing particular ones of the second logical means from producing a particular output when the individual one of the first logical means produces the particular output, the particular ones of the second logical means being coupled to the first logical means responsive to fractions of the reference voltage less than that to which the individual one of the first logical means responds.

16. In a flash type of analog-to-digital converter as set forth in claim 15, means for synchronizing the operation of the first logical means with a clocking sign al, and means for synchronizing the operation of the second logical means with a strobe signal occurring in time after the clocking signal.

17. In a flash type of analog-to-digital converter as set forth in claim 16, means for resetting the second logical means to a state other than the particular state before the occurrence of the second clocking signal.

18. In a flash type of analog-to-digital converter as set forth in claim 17, means for providing for the production of the particular output from the second logical means responsive to fractions of the reference voltage greater than the fraction of the reference voltage to which the individual one of the second logical means responds, means for preventing the individual one of the second logical means from providing the particular output when the second logical means responsive to the greater fraction of the reference voltage provides the particular output, the first logical means including a plurality of latches, and the second logical means including a plurality of NOR gates.

19. In a flash type of analog-to-digital converter as set forth in claim 18, the non-consecutive one of the first logical means being separated from the individual one of the first logical means by another one of the first logical means between the individual one of the first logical means and the non-consecutive one of the first logical means.

20. In a flash type of analog-to-digital converter as set forth in claim 15, means for providing for the production of the particular output from the second logical means responsive to fractions of the reference voltage greater than the fraction of the reference voltage to which the individual one of the first logical means responds, and means for preventing the individual one of the second logical means from providing the particular output when the second logical means responsive to the greater fraction of the reference voltage provides the particular output.

21. In a flash type of analog-to-digital converter as set forth in claim 16, means for providing a clocking signal, and means for providing for the selection of the particular output from the selected one of the individual one of the second logical means and the second logical means responsive to the greater fraction of the reference voltage, such selection being dependent upon the time of the production of the particular output from the second logical mean s responsive to the greater fraction of the reference voltage means relative to the time of the provision of the clocking signal.

22. In a flash type of analog-to-digital converter as set forth in claim 15, the first logical means including a plurality of latches, the second logical means including a plurality of NOR gates.

23. In a flash type of analog-to-digital converter as set forth in claim 15, the non-consecutive one of the first logical means being separated from the individual one of the first logical means by another one of the first logical means between the individual one of the first logical means and the non-consecutive one of the first logical means.

24. In flash type of analog-to-digital converter, means for providing an input voltage, means for providing a reference voltage, means for dividing the reference voltage into voltages each representing a progressive fraction of the reference voltage, comparing means each operative to compare the input voltage and an individual one of the progressive fractions of the reference voltage and to provide an output dependent upon such comparison, and logical means each operative to provide a particular output dependent upon the outputs from an individual one of the comparing means and another one of the comparing means non-consecutive with the individual one of the comparing means but responsive to a higher progressive fraction of the reference voltage than the individual one of the logical means, each of the logical means being operative to provide the particular output without being dependent upon the output from the comparing means consecutive with the individual one of the comparing means.

25. In flash type of analog-to-digital converter, means for providing an input voltage, means for providing a reference voltage, means for dividing the reference voltage into voltages each representing a progressive fraction of the reference voltage, comparing means each operative to compare the input voltage and an individual one of the progressive fractions of the reference voltage and to provide an output dependent upon such comparison, and logical means each operative to provide a particular output dependent upon the outputs from an individual one of the comparing means and another one of the comparing means non-consecutive with the individual one of the comparing means but responsive to a higher progressive fraction of the reference voltage than the individual one of the logical means, and means responsive to the particular output from the individual one of the logical means for preventing the particular output from being produced from any of the logical means except the logical means responsive to a higher progressive fraction of the reference voltage than the individual one of the logical means.

26. In flash type of analog-to-digital converter, means for providing an input voltage, means for providing a reference voltage, means for dividing the reference voltage into voltages each representing a progressive fraction of the reference voltage, comparing means each operative to compare the input voltage and an individual one of the progressive fractions of the reference voltage and to provide an output dependent upon such comparison, and logical means each operative to provide a particular output dependent upon the outputs from an individual one of the comparing means and another one of the comparing means non-consecutive with the individual one of the comparing means but responsive to a higher progressive fraction of the reference voltage than the individual one of the logical means, means for providing a strobe signal, and means for providing for the production, after the production of the particular signal by the individual one of the logical means, of the particular output from one of the logical means responsive to a higher progressive fraction of the reference voltage than the individual one of the logical means when such logical means responsive to the higher progressive fraction of the reference voltages produces the particular output before the provision of the strobe signal.

27. In a flash type analog-to-digital converter as set forth in claim 26, means for resetting the logical means to obtain an output different from the particular output before the provision of the strobe signal.

28. In a flash type analog-to-digital converter, means for providing an input voltage, means for providing a reference voltage, means for dividing the reference voltage into voltages each representing a progressive fraction of the reference voltage, comparing means each operative to compare the input voltage and an individual one of the progressive fractions of the reference voltage and to provide an output dependent upon such comparison, and logical means each operatively coupled to an individual non-consecutive pair of the comparing means to provide a resolution in such logical means faster than such logical means would provide if it were connected to a successive pair of the comparing means.

29. In a flash type analog-to-digital converter as set forth in claim 28, each of the logical means being connected to the comparing means in the same non-consecutive pattern of the comparing means as the individual pair of the non-consecutive comparing means.

30. In a flash type analog-to-digital converter as set forth in claim 29, means for providing for the production of the output from the logical means responsive to a higher fraction of the reference voltage than the individual one of the logical means after the production of the output from the individual one of the logical means.

31. In a flash type analog-to-digital converter as set forth in claim 28, each of the comparing means having a first output for a first imbalance between the magnitudes of the input voltage and an individual one of the progressive fractions of the reference voltage and having a second output for a second imbalance, opposite to the first imbalance, between the magnitudes of the input voltage and the individual one of the progressive fractions of the reference voltage, each of the logical means being connected to receive the first output from one of the comparing means in the non-consecutive pair an d the second output from the other one of the comparing means in the non-consecutive pair.

32. In a flash type analog-to-digital converter as set forth in claim 31, means for providing an output from an individual one of the logical means in accordance with the pattern of the signals from the non-consecutive comparators coupled to such logical means, and means for preventing any of the logical means responsive to a lower fraction of the reference voltage than the individual one of the logical means from providing an output upon the production of the output from the individual one of the logical means.

33. In flash type analog-to-digital converter, means for providing an input voltage, means for providing a reference voltage, means for dividing the reference voltage into voltages each representing a progressive fraction of the reference voltage, comparing means each operative to compare the input voltage and an individual one of the progressive fractions of the reference voltage and to provide an output dependent upon such comparison, logical means each responsive to the output from an individual pair of comparing means in a particular relationship to provide a particular output in accordance with the outputs from the comparing means in the individual pair, and means responsive to the particular output from an individual one of the logical means for thereafter providing the particular output only from such individual one of the logical means or the logical means responsive to the progressive fractions of the reference voltage greater than the progressive fraction to which the individual one of the logical means responds.

34. In a flash type analog-to-digital converter as set forth in claim 33, means for providing a strobe signal, and means responsive to the production of the particular output from the individual one of the logical means or the logical means responsive to the greater fractions of the reference voltage than the individual one of the logical means for providing the particular output from a selective one of the individual one of the logical means and the logical means responsive to the greater fractions of the reference voltage dependent upon the time of production of such particular outputs relative to the time of production of the strobe signal.

35. In a flash type analog-to-digital converter as set forth in claim 34, means responsive to the production of the particular output from the logical means responsive to the greater fraction of the reference voltage for preventing the individual one of the logical means from providing the particular output, and means responsive to the production of the particular output from the individual one of the logical means for preventing the production of the particular output from the logical means responsive to the particular fractions of the reference voltage less than that to which the individual one of the logical means responds from providing the particular output.

36. In a method as set forth in claim 35, the steps of:

providing a strobe signal, and providing the particular output indicating the particular relationship between the fraction of the reference voltage and the input voltage when the strobe signal is produced.

37. In a method as set forth in claim 36, the steps of:

providing the particular output indicating the particular relationship between another fraction of the reference voltage and the input voltage when such another fraction of the reference voltage is greater than the particular fraction of the reference voltage, and providing the particular output from such another one of the particular fraction of the reference voltage to indicate the digital value of the input voltage when such particular output is provided before the strobe signal.

38. In a flash type analog-to-digital converter as set forth in claim 33, means responsive to the production of the particular output from the logical means responsive to the greater fraction of the reference voltage for preventing the individual one of the logical means from providing the particular output.

39. In a flash type analog-to-digital converter as set forth in claim 33, means responsive to the production of the particular output from the individual one of the logical means for preventing the production of the particular output from the logical means responsive to the particular fractions of the reference voltage less than that to which the individual one of the logical means responds.

40. In a method of converting an analog voltage to a digital voltage, the steps of:

providing an analog input voltage, providing progressive fractions of a reference voltage, comparing the analog input voltage and each progressive fraction of the reference voltage to output provide first and second outputs for each comparison, one output indicating whether the input voltage is less than such progressive fraction of the reference voltage and the other output indicating whether the input voltage is greater than such progressive fraction of the reference voltage, pairing the first output from each of the comparisons and the second output from another one of the comparisons to provide a particular output indicating a particular relationship between the particular fraction of the reference voltage and the input voltage, and preventing the particular output from being obtained from pairs of comparator outputs involving lower fractions of the reference voltage than the particular fraction of the reference voltage involved in the particular relationship with the input voltage.

41. In a method as set forth in claim 40, the steps of:

providing a clock signal, and latching the first and second outputs resulting from each comparison of the input voltage and each progressive fraction of the reference voltage when the clock signal is produced.

42. In a method as set forth in claim 41, the steps of:

resetting each pair of the first and second outputs to prevent the particular output from being produced in such pair, providing a strobe signal, and providing the particular output indicating the particular relationship between the particular fraction of the reference voltage and the input voltage when the strobe signal is produced.

43. In a method of converting an analog voltage to a digital voltage, the steps of:

providing an analog input voltage, providing progressive fractions of a reference voltage, comparing the analog input voltage and each progressive fraction of the reference voltage to provide first and second outputs for each comparison, one output indicating whether the input voltage is less than such progressive fraction of the reference voltage and the other output indicating whether the input voltage is greater than such progressive fraction of the reference voltage, and pairing the first output from each individual one of the comparisons and the second output from another one of the comparisons non-consecutive with the individual one of the comparisons to provide a particular output indicating a particular relationship between a particular fraction of the reference voltage and the input voltage, the step of pairing the first output for each individual one of the comparisons and the second output for another one of the comparisons being performed without an output from the comparison consecutive with the individual one of the comparisons.

44. In a method as set forth in claim 43 wherein each individual one of the paired comparison outputs involves only the first output from each individual one of the comparisons and the second output from another one of the comparisons non-consecutive with such individual one of the comparisons.

45. In a method of converting an analog voltage to a digital voltage, the steps of:

providing an analog input voltage, providing progressive fractions of a reference voltage, comparing the analog input voltage and each progressive fraction of the reference voltage to provide first and second outputs for each comparison, one output indicating whether the input voltage is less than such progressive fraction of the reference voltage and the other output indicating whether the input voltage is greater than such progressive fraction of the reference voltage, and pairing the first output from each individual one of the comparisons and the second output from another one of the comparisons non-consecutive with the first individual one of the comparisons to provide a particular output indicating a particular relationship between a particular fraction of the reference voltage and the input voltage, each individual one of the paired comparisons involving the first output from each individual one of the comparisons and the second output from another one of the comparisons non-consecutive with, and displaced by one from, such individual one of the comparisons.

46. In a method as set forth in claim 45, the step of:

preventing the particular output from being produced from the paired comparisons involving a lower fraction of the reference voltage than the paired comparison involving the particular fraction of the reference voltage.

* * * * *